(12) United States Patent
Lee et al.

(10) Patent No.: US 7,652,948 B2
(45) Date of Patent: Jan. 26, 2010

(54) NONVOLATILE MEMORY DEVICES AND PROGRAMMING METHODS USING SUBSETS OF COLUMNS

(75) Inventors: Ho-Kil Lee, Gyeonggi-do (KR); Jin-Yub Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 130 days.

(21) Appl. No.: 11/282,237

(22) Filed: Nov. 18, 2005

(65) Prior Publication Data
US 2006/0114730 A1 Jun. 1, 2006

(30) Foreign Application Priority Data
Dec. 1, 2004 (KR) .................. 10-2004-0099953

(51) Int. Cl.
*G11C 8/00* (2006.01)
(52) U.S. Cl. ............... 365/230.08; 365/185.22
(58) Field of Classification Search ............ 365/189.05, 365/238.5, 185.12, 185.22; 711/217, 218, 711/219, 103
See application file for complete search history.

(56) References Cited

U.S. PATENT DOCUMENTS

| | | | |
|---|---|---|---|
| 5,677,873 A | 10/1997 | Choi et al. | |
| 5,991,202 A | 11/1999 | Derhacobian et al. | |
| 6,215,714 B1 * | 4/2001 | Takemae et al. | 365/222 |
| 6,282,121 B1 * | 8/2001 | Cho et al. | 365/185.22 |
| 6,335,881 B2 | 1/2002 | Kim et al. | |
| 6,385,113 B1 * | 5/2002 | Longwell et al. | 365/222 |
| 6,463,516 B1 * | 10/2002 | Leong et al. | 711/170 |
| 6,496,415 B2 * | 12/2002 | Tsao | 365/185.12 |
| 6,687,158 B2 | 2/2004 | Yano | |
| 6,845,041 B2 * | 1/2005 | Lee | 365/185.17 |
| 2001/0053092 A1 | 12/2001 | Kosaka et al. | |
| 2002/0145908 A1 | 10/2002 | Tsao | |
| 2004/0027901 A1 | 2/2004 | Shiga et al. | |
| 2004/0109352 A1 | 6/2004 | Lee et al. | |

FOREIGN PATENT DOCUMENTS

| | | |
|---|---|---|
| JP | 2003-317490 A | 11/2003 |
| JP | 2004-22112 A | 1/2004 |
| KR | 1998-0035242 A | 8/1998 |
| KR | 2000-0059746 A | 10/2000 |
| KR | 10-2005-0108986 A | 11/2005 |
| TW | 200303023 | 8/2003 |

OTHER PUBLICATIONS

Search Report and English language translation of Preliminary Notice of First Office Action, Taiwanese Application No. 094142259, Mar. 12, 2008.

* cited by examiner

*Primary Examiner*—J. H. Hur
*Assistant Examiner*—Douglas King
(74) *Attorney, Agent, or Firm*—Myers Bigel Sibley & Sajovec, P.A.

(57) ABSTRACT

Nonvolatile memory devices include a memory cell array having memory cells arranged in rows and columns, and an address storing unit that is configured to store therein an indicator of an initial column address and an indicator of an end column address, to identify a subset of the columns that extends from the initial column address to the end column address. A program circuit is configured to verify a programming operation for a selected row at the subset of the columns that extends from the initial column address to the end column address. Analogous methods of programming a nonvolatile memory device also may be provided.

58 Claims, 7 Drawing Sheets

NONVOLATILE MEMORY DEVICES AND PROGRAMMING METHODS USING SUBSETS OF COLUMNS

CROSS-REFERENCE TO RELATED APPLICATION

This application claims the benefit under 35 USC § 119 of Korean Patent Application No. 2004-0099953 filed on Dec. 1, 2004, the disclosure of which is hereby incorporated herein by reference in its entirety as if set forth fully herein.

FIELD OF THE INVENTION

The present invention is concerned with nonvolatile memory devices. In particular, the present invention relates to programming systems and methods for nonvolatile memory devices.

BACKGROUND OF THE INVENTION

Semiconductor memory devices are widely used in many consumer, commercial and other devices. Semiconductor memory devices may be characterized as volatile memory devices or nonvolatile memory devices. In the volatile memory devices, information may be stored by setting up a logic state of bistable flip-flop such as in a static random access memory, through charging of a capacitor as in a dynamic random access memory and/or using other techniques. The data are stored and can be read out as long as the power is applied, and is lost when the power is turned off.

Nonvolatile memory devices such as MROM, PROM, EPROM, and EEPROM are capable of storing the data, even with the power turned off. The nonvolatile memory data storage mode may be permanent or reprogrammable, depending upon the fabrication technology used. A combination of single-chip volatile as well as memory storage modes is also available in devices such as SRAM (nvRAM). In addition, many special memory architectures have evolved which contain some additional logic circuitry to match their performance for application-specific tasks.

In nonvolatile semiconductor memory devices, MROM, PROM, and EPROM are generally not erasable and readable freely, so that it is generally difficult for users to reprogram the memory. Unlike this, EEPROM devices are electrically erasable and writable. Flash EEPROM (hereinafter, referred to as a "flash memory) may provide a higher density as compared with a conventional EEPROM. Moreover, a NAND-type flash memory may provide higher density than a NOR-type flash memory. The various classifications and architectures for various types of nonvolatile memory devices are well known to those having skill in the art and need not be described further herein.

FIG. 1 is a block diagram of a conventional NAND-type flash memory device. Referring to FIG. 1, a NAND-type flash memory device 10 includes a memory cell array 20, a row selection circuit 40 that is denoted by "X-SEL" in FIG. 1, and a page buffer circuit 60. A memory cell array 20 includes a plurality of cell strings (or NAND strings) 21, which are connected to bit lines BL0-BLm, respectively. A cell string 21 of a respective column is formed of a string selection transistor (SST) as a first selection transistor, a ground selection transistor (GST) as a second selection transistor, and a plurality of flash EEPROM cells or other nonvolatile memory cells (MC0-MCn) that are serially connected between the selection transistors SST and GST. The string selection transistor (SST) of a respective column has a drain and a gate. The drain is connected to a corresponding bit line, and the gate is connected to a string selection line (SSL). The ground selection transistor (GST) has a source connected to a common source line (CSL) and a gate connected to a ground selection line (GSL). Memory cells (MCn-MC0) are serially connected between the source of the string selection transistor (SST) and the drain of the ground selection transistor (GST). Cells of the respective cell strings may be formed of floating gate transistors, and control gates of these transistors are connected to corresponding word lines (WLn-WL0).

The string selection line (SSL), word lines (WL0-WLn), and ground selection line (GSL) are electrically connected to the row selection circuit 40. The row selection circuit 40 selects one of the word lines according to row address information and provides word line voltages according to the respective operation modes to the selected word line and non-selected word lines. For example, the row selection circuit 40 provides a program voltage to a word line that is selected during a program operation mode and a pass voltage to non-selected word lines. The row selection circuit 40 provides a ground voltage GND to a word line selected during a reading operation mode and a read voltage to non-selected word lines. The program voltage, the pass voltage, and the read voltage are generally higher voltage than a power supply voltage. The bit lines BL0-BLm are electrically connected to the page buffer circuit 60. The page buffer circuit 60 senses data from memory cells of a selected word line through the bit lines BL0-BLm in read/verification operation mode. In addition, the page buffer circuit 60 respectively provides a power voltage (or a program-inhibit voltage) or a ground voltage (or a program voltage) to the bit lines BL0-BLm according to data to be programmed in a program operation mode. Page buffers respectively corresponding to the bit lines BL0-BLm may be provided in the page buffer circuit 60. Each page buffer can be embodied so as to share two bit lines. The operation of a nonvolatile device 10 as illustrated in FIG. 1 is well known to those having skill in the art and need not be described further herein.

In the NAND-type flash memory device, as is well known, a cell not to be programmed from the viewpoint of a cell structure may be undesirably soft-programmed. This is often called a "program disturbance". The program disturbance of the program inhibited cell can be prevented by enhancing a channel voltage of a cell string including the program inhibited cell. This is often called a "self-boosting scheme". The channel voltage depends on a pass voltage that is respectively supplied to non-selected word lines. The pass voltage becomes high, which can alleviate a degree of soft programming of the program inhibited cell. On the other hand, if the pass voltage becomes high, memory cells connected to each of non-selected word lines may be soft programmed by the pass voltage. This is often called a "pass disturbance". Accordingly, the pass voltage level may be determined by considering the above-mentioned conditions.

The above-mentioned program inhibition method utilizing a self-boosting scheme is disclosed in U.S. Pat. No. 5,677,873 entitled "Methods Of Programming Flash EEPROM Integrated Circuit Memory Devices To Prevent Inadvertent Programming Of Non designated NAND Memory Cells Therein" and U.S. Pat. No. 5,991,202 entitled "Method For Reducing Program Disturb During Self-Boosting In A NAND Flash Memory", both of whose disclosures are incorporated herein by reference.

In the NAND-type flash memory device, multiple memory cells connected to one word line may be programmed at the same time. In addition, the memory cells may be programmed several times, and this is generally called a "partial program scheme". For instance, as shown in FIG. 2, it is assumed that only data to be programmed in a memory region of the bit lines BL0-BLi is loaded in the page buffer circuit 60 (see oblique lines in FIG. 2). Since the memory cells of a region where data is loaded, the memory cells of a memory region where data is not loaded and bit lines BLi+1-BLm are connected to the same word line, a program voltage is supplied to the memory cells of the same word line irrespective of a data loading position. A program operation is performed, and then a program verification operation is performed, as is well known.

In accordance with the program verification operation, the page buffer circuit 60 senses and latches data from the memory cells of a selected row (or page). The program state of the sensed data may be detected by a wired-OR mode in a column scan mode. In accordance with a column scan mode, sensed data values are selected through a column selection circuit (not shown) by a predetermined unit (e.g., x8, x16, and so forth), and then whether or not the selected data values indicate a program state is detected. If the selected data values indicate a program state, the data values by a next predetermined unit are selected. This program verification operation is performed with respect to all memory cells. That is, the program verification operation employing a column scan mode is performed with respect to all memory cells of the selected page irrespective of the amount of data to be programmed. For instance, referring to FIG. 2, even though memory cells connected to bit lines BL0-BLi are programmed substantially, the program verification operation is performed with respect to the memory cells connected to bit lines BL0-BLi. This means that the above-mentioned program verification operation utilizing the column scan mode may be inefficient.

Published U.S. Patent Application 2004/0027901 A1, published Feb. 12, 2004, describes a nonvolatile semiconductor memory device. As stated in the Abstract of this published U.S. Patent Application, a nonvolatile semiconductor memory device capable of performing page programming at high speeds is provided. This nonvolatile memory device includes a cell array with a matrix of rows and columns of electrically writable and erasable nonvolatile memory cells, and a write control circuit which writes or "programs" one-page data into this cell array at a plurality of addresses within one page. The write control circuit is operable to iteratively perform iteration of a write operation for the plurality of addresses corresponding to one page and iteration of a verify-read operation of the plurality of addresses after writing until verify-read check is passed with respect to every address involved. Regarding an address or addresses with no cells to be written any more, the write control circuit skips the write operation and the after-write verify-read operation.

SUMMARY OF THE INVENTION

Nonvolatile memory devices according to exemplary embodiments of the invention include a memory cell array having memory cells arranged in rows and columns, and an address storing unit that is configured to store therein an indicator of an initial column address and an indicator of an end column address, to identify a subset of the columns that extends from the initial column address to the end column address. A program circuit is configured to verify a programming operation for a selected row at the subset of the columns that extends from the initial column address to the end column address. In some embodiments, the program circuit is further configured to perform a programming operation of the subset of the columns that extends from the initial column address to the end column address, for the selected row. Moreover, in some embodiments, the columns correspond to a page of the memory cell array, and the subset of the columns correspond to a subset of the columns of the page. Analogous methods of programming a nonvolatile memory device also may be provided.

According to other exemplary embodiments of the present invention, a nonvolatile memory device comprises a memory cell array having memory cells arranged in rows and columns and a page buffer circuit configured to read data bits from memory cells of a selected row during a program verification. An address storing circuit is configured to store column address information of data to be programmed in the memory cell array, wherein the column address information includes an initial column address and an end column address. An address generating circuit is configured to sequentially generate column addresses to select the read data bits in responsive to the initial address of the address storing circuit. A scan control circuit is configured to end a program operation mode when a column address generated from the address generating circuit is consistent with the end column address.

In some embodiments, the initial column address is stored in the address storing circuit before the data to be programmed is loaded in the page buffer circuit. In some embodiments, the address generating circuit sequentially generates column addresses while the data bits to be programmed are loaded in the page buffer circuit. In some embodiments, when all of the data bits to be programmed are loaded in the page buffer circuit, a column address finally generated in the address generating circuit is stored as the end column address in the address storing circuit. In some embodiments, the initial and end column addresses are stored in the address storing circuit before the data to be programmed is loaded in the page buffer circuit.

In other embodiments, a column gate circuit is further included. The column gate circuit is configured to select the read data bits in response to the column address of the address generating circuit. In some embodiments, the scan control circuit controls the address generating circuit according to whether all of the data bits selected by the column gate circuit are in a program state. Moreover, in some embodiments, when all of the selected data bits are in a program state, the scan control circuit controls the address generating circuit so as to generate a next column address. In other embodiments, when a part of the selected data bits is in a program state, the scan control circuit controls the address generating circuit so as not to generate a next column address.

In some embodiments, data to be programmed is a same or smaller size as a size of the selected row. Moreover, in some embodiments, the scan control circuit is structured to interface with an external device according to one of a NAND interface mode, a NOR interface mode, and a SRAM interface mode.

According to other exemplary embodiments of the present invention, a nonvolatile memory device comprises a memory cell array having memory cells arranged into rows and columns and a page buffer circuit configured to read data bits from the memory cells of a selected row during a program verification An address storing circuit is configured to store column address information of data to be programmed in the memory cell array, wherein the column address information includes an initial column address and an end column address. A column selection circuit is configured to sequentially select the data bits in response to the initial column address of the address storing circuit during the program verification. A scan control circuit is configured to control an end of a program operation mode in response to the selected data bits and the end column address.

In some embodiments, the column selection circuit includes an address generating circuit configured to sequentially generate column addresses in response to the initial column address and a column gate circuit configured to select the read data bits in response to the column address. In some embodiments, the scan control circuit is configured to control the address generating circuit according to whether all of the data bits selected by the column gate circuit are in a program state. In some embodiments, when all of the selected data bits are in a program state, the scan control circuit controls the address generating circuit so as to generate a next column address. In other embodiments, when a part of the selected data bits are in a program state, the scan control circuit controls the address generating circuit so as not to generate a next column address. In some embodiments, the scan control circuit ends the program operation mode when a column address generated from the address generating circuit is consistent with the end column address.

In some embodiments, the initial column address is stored in the address storing circuit before the data to be programmed is loaded in the page buffer circuit. In some embodiments, the address generating circuit sequentially generates column addresses while the data bits to be programmed are loaded in the page buffer circuit. In some embodiments, when all of the data bits to be programmed are loaded in the page buffer circuit, a column address finally generated in the address generating circuit is stored as the end column address in the address storing circuit. In some embodiments, the initial and end column addresses are stored in the address storing circuit before the data to be programmed is loaded in the page buffer circuit.

In other embodiments, the scan control circuit includes a data judging circuit that is configured to judge whether all of data bits selected by the column gate circuit are in a program state. A detecting circuit is configured to detect whether a column address generated in the address generating circuit is consistent with the end column address. A control logic circuit is configured to control the end of the program operation mode in response to a judging result of the data judging circuit and a detecting result of the detecting circuit.

In some embodiments, when only a part of data bits selected by the column gate circuit is in a program state, a next column address by the address generating circuit is not generated. In some embodiments, when a column address generated in the address is an end column address, the control logic circuit ends the program operation mode. In some embodiments, when a column address generated in the address is an end column address, the control logic ends the program operation mode. In some embodiments, the control logic circuit is configured to interface with an external device according to one of a NAND interface mode, a NOR interface mode, and a SRAM interface mode.

According to still other exemplary embodiments of the present invention, a nonvolatile memory device comprises a memory cell array having memory cells arranged in rows and columns and a page buffer circuit configured to read data bits from the memory cells of a selected row during a program verification. An address storing circuit is configured to store column address information of data to be programmed in the memory cell array, wherein the column address information includes an initial column address and an end column address. An address generating circuit is configured to generate a column address in response to an initial column address of the address storing circuit. A column gate circuit is configured to select the data bits in response to the column address. A data judging circuit is configured to detect whether the selected data bits are in a program state. The address generating circuit is controlled by a judging result of the data judging circuit. A detecting circuit is configured to detect whether a column address generated in the address generating circuit is consistent with an end column address of the address storing circuit. A control logic circuit is configured to control an end of a program operation mode in responsive to a detecting result of the detecting circuit and the judging result of the data judging circuit.

According to still other exemplary embodiments of the present invention, methods are provided for programming nonvolatile memory devices including memory cells arranged in rows and columns. These methods comprise storing column address information including initial and end column addresses, and performing a column scan operation according to the column address information after a program operation. In these embodiments, only columns of a loaded data region defined by the initial and end column addresses during the column scan operation are scanned.

In some embodiments, performing the column scan operation includes generating a column address to select the columns in response to the initial column address during the column scan operation, and determining an end of a program operation mode according to whether the generated column address is consistent with the end column address. In some embodiments, performing the column scan operation further includes ending the program operation mode when the generated column address is consistent with the end column address. In some embodiments, data to be programmed is loaded before the program operation.

DETAILED DESCRIPTION OF PREFERRED EMBODIMENTS

Figure 1:
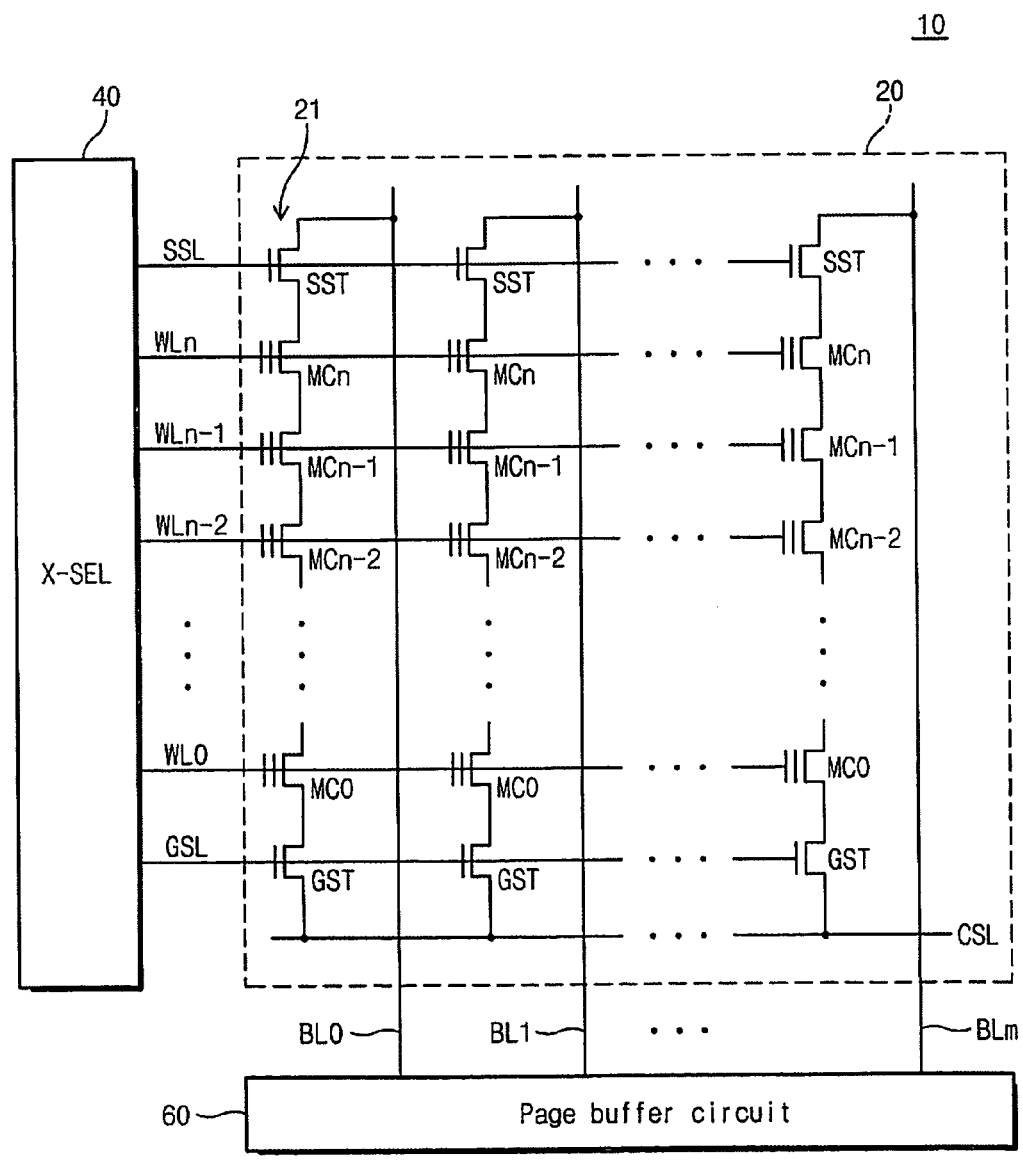
FIG. 1 is a block diagram of a conventional NAND-type flash memory device.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that when an element is referred to as being "connected", "responsive" or "in response to" another element, it can be directly connected, responsive or in response to the other element or intervening elements may be present. In contrast, the term "directly" means there are no intervening elements present. As used herein, the term "and/or" includes any and all combinations of one or more of the associated listed items and may be abbreviated as "/".

It also will be understood that, as used herein, the terms "row" or "horizontal" and "column" or "vertical" indicate two relative non-parallel directions that may be orthogonal to one another. However, these terms do not require an absolute horizontal or vertical orientation as shown in the figures.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
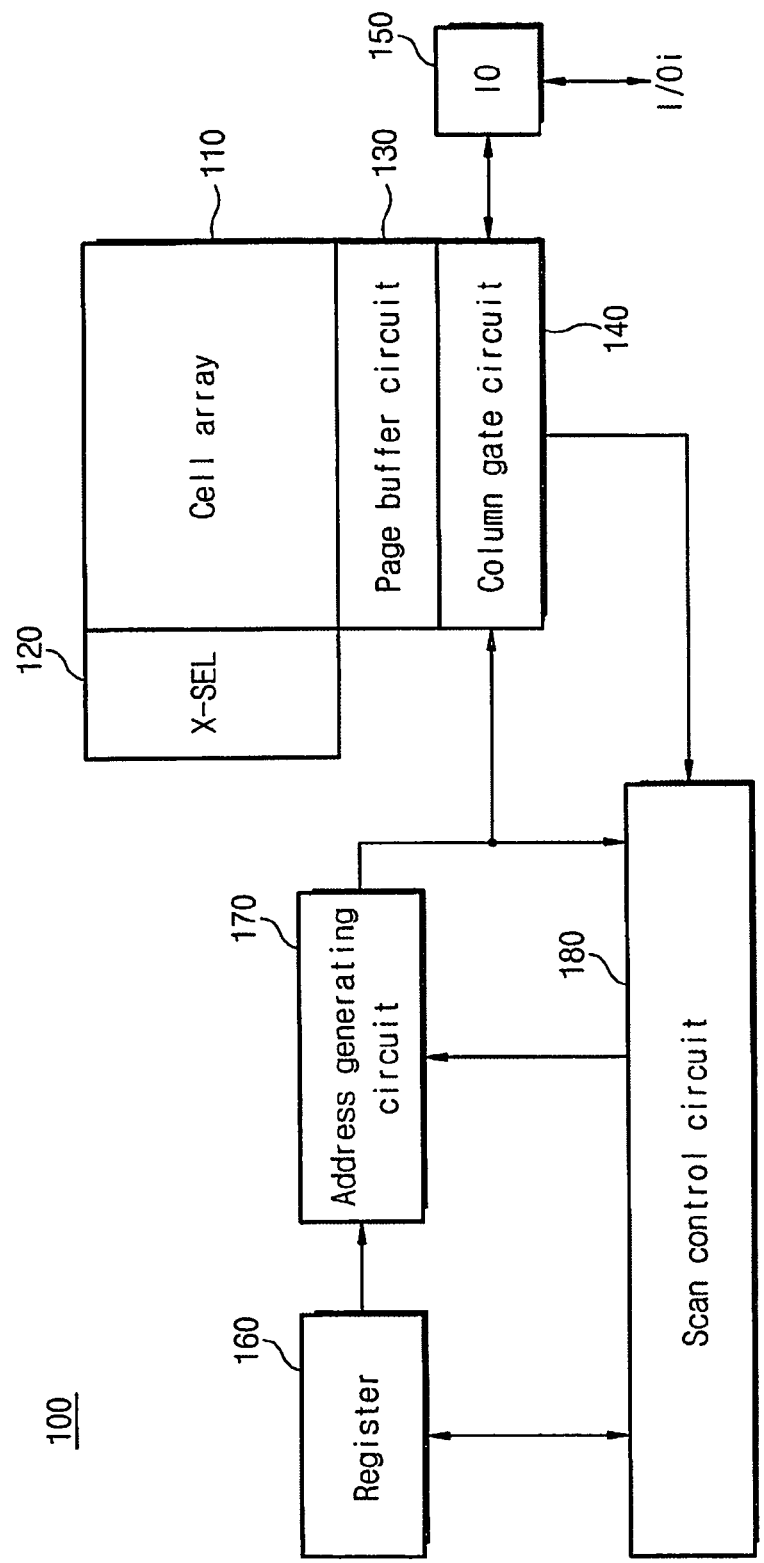
FIG. 3 is a schematic block diagram of a nonvolatile memory device according to exemplary embodiments of the present invention.

FIG. 3 is a block diagram of a nonvolatile memory device according to exemplary embodiments of the present invention. The nonvolatile memory device described below is a NAND-type nonvolatile memory device. However, it is apparent in those skilled in the art that the present invention is applicable to other programmable memory devices (e.g., MROM, PROM, FRAM and/or NOR-type flash memory device).

With reference to FIG. 3, the nonvolatile memory device 100 includes a memory cell array 110, a row selecting circuit 120, a page buffer circuit 130, a column gate circuit 140, an input/output (IO) circuit 150, an address storing circuit 160 such as a register, an address generating circuit 170 and a scan control circuit 180. The memory cell array 110, the row selecting circuit 120, and the page buffer circuit 130 can be the same as those in FIG. 1, and their description is not repeated here. Moreover, it will be understood that the memory cell array 110 may correspond to a page of a nonvolatile memory device 100.

The column gate circuit 140 selects page buffers by a predetermined unit (e.g., bit structure: x8, x16 and so forth) in response to a column address from the address generating circuit 170. During a program operation, data bits (word data or byte data) input by the input/output circuit 150 are stored in the selected page buffers by the column gate circuit 140. During a read operation, data bits (word data or byte data) of selected page buffers are transferred through the column gate circuit 140 to the input/output circuit 150. During a program verification operation, data bits (word data or byte data) of selected page buffers are transferred through the column gate circuit 140 to the scan control circuit 180. During the program verification operation, columns (or page buffers) are sequentially selected by a predetermined unit through the column gate circuit 140 according to a column address that is generated from the address generating circuit 170. This operation is hereinafter called a "column scanning operation". The address storing circuit 160 stores column address information of data to be programmed according to a control of the scan control circuit 180. As noted above, the address storing circuit 160 may be embodied by a register. Column address information includes an initial column address and an end column address, which will be programmed. The initial column address is a column address corresponding to byte/word data that is input first among data to be programmed, and the end column address is a column address corresponding to byte/word data that is the last input among data to be programmed. The end column address may be different based on the program modes. For example, in one mode, a part of memory cells of one page is programmed. In another mode, all of the memory cells of one page are programmed.

The address generating circuit 170 is controlled by the scan control circuit 180, and generates a column address in response to the initial column address stored in the address storing circuit 160. For instance, while data to be programmed is loaded in the page buffer circuit 130, the address generating circuit 170 sequentially generates column addresses in response to the initial column address stored in the address storing circuit 160. The column address is generated until all data to be programmed is stored in the page buffer circuit 130.

Figure 2:
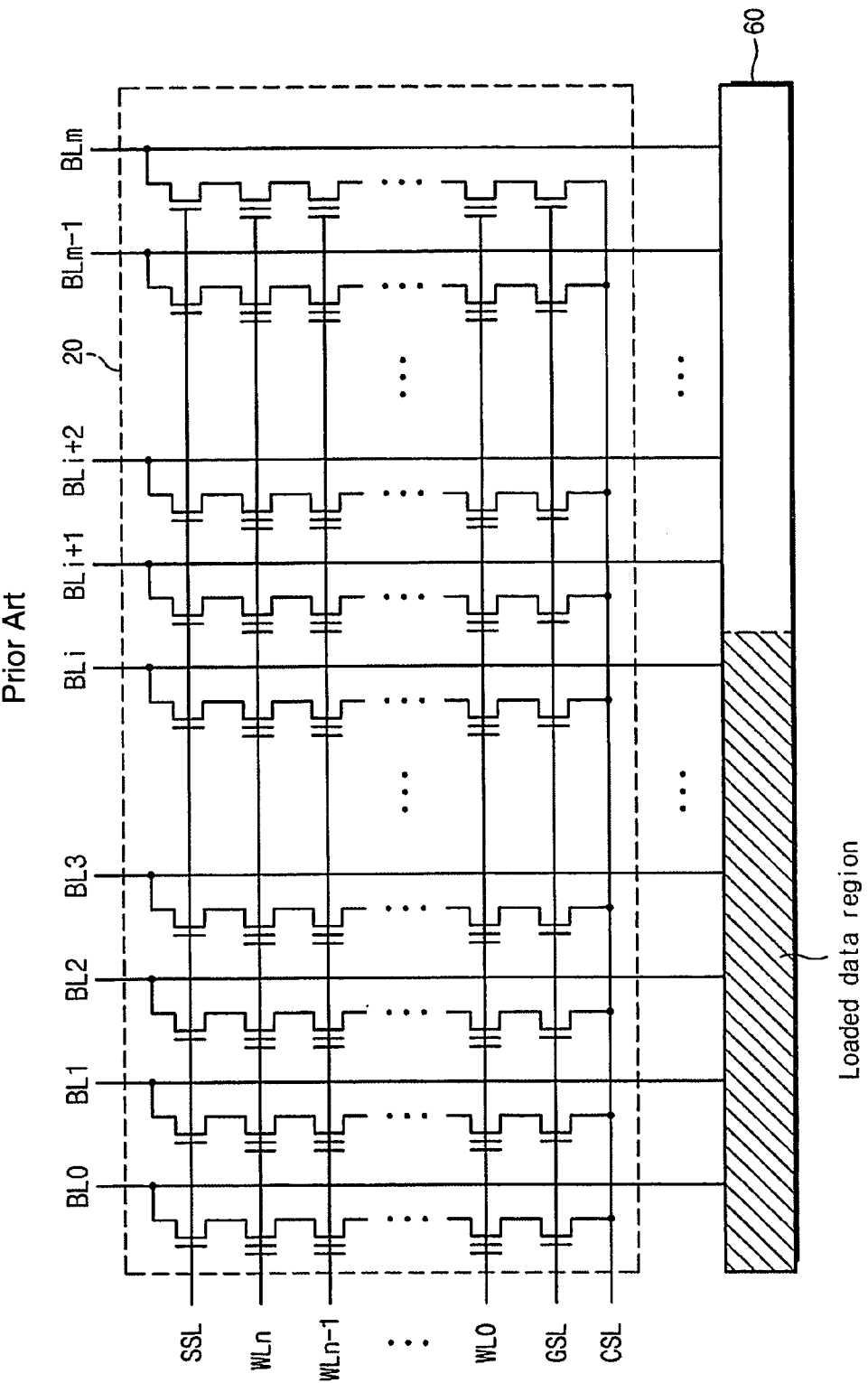
FIG. 2 shows a page buffer circuit of FIG. 1 in which data is partially loaded according to a partial program operation.

In this case, the initial and end column addresses may be stored in the address storing circuit 160 before data is loaded in the page buffer circuit 130. In other embodiments, the initial column address is stored in the address storing circuit 160 before data is loaded in the page buffer circuit 130, and after data is loaded in the page buffer circuit 130, the end column address is stored in the address storing circuit 160. In the latter case, the end column address is created by the address generating circuit 170. In other words, the last column address created by the address generating circuit 170 as an end column address may be stored in the address storing circuit 160 according to a control of the scan control circuit 180. Accordingly, a loading region (for example, the oblique lines in FIG. 2) of data to be programmed can be defined by initial and end column addresses that are stored in the address storing circuit 160. Also, a column scan range may be defined by the initial and end column addresses that are stored in the address storing circuit 160 during a program verification operation.

Still referring to FIG. 3, the scan control circuit 180 ends a program operation (or a program verification operation with respect to read data bits) according to whether a column address generated from the address generating circuit 170 is consistent with an end column address or not. In some embodiments, the column address generated from the address generating circuit 170 is consistent with an end column address when it is identical or reaches the end column address. However, in other embodiments, depending upon the structure of the circuitry, the column address generated from the address generating unit can be consistent with the end column address even when it is not identical to the end column address. For example, in some embodiments, the column address generated from the address generating circuit is consistent with the end column address when the column address is one less or one more than the end column address. In some embodiments, when the column address generated from the address generating circuit 170 is identical to the end column address of the address storing circuit 160, the scan control circuit 180 ends a program operation (or a program verification operation). Moreover, the scan control circuit 180 controls the address generating circuit 170 according to whether all of data bits selected by the column gate circuit 140 are in a program state or not. For instance, when all of the selected data bits are in a program state, the scan control circuit 180 controls the address generating circuit 170 so as to generate a next column address. In contrast, when the selected data bits are partially in a program state, the scan control circuit 180 controls the address generating circuit so as not to generate next column address.

In accordance with a nonvolatile memory device 100 according to exemplary embodiments of the present invention, the program verification operation is performed with respect to only a region where data to be programmed is loaded (for example, not all memory cells of one page). The region is defined by the initial and end column addresses according to exemplary embodiments of the invention. Thus, it is possible to reduce a program time by controlling a program verification time (and/or a column scan time) depending on the amount of data to be programmed.

Accordingly, in some embodiments of the invention, an address storing unit may be provided that is configured to store therein an indicator of an initial column address and an indicator of an end column address. The indicators may correspond identically to the initial column address and the end column address, respectively, in some embodiments. However, in other embodiments, depending on the configuration of the circuitry, the indicators need not correspond identically to the initial column address and/or the end column address. For example, the indicators may correspond to an initial column address and an address offset therefrom, in some embodiments. In other embodiments, the indicators may correspond to one more, one less or other differentials from the initial column address and/or the end column address. In any event, the indicator of a column address and the indicator of an end column address identify a subset of the columns, i.e., less than all of the columns, that extends from the initial column address to the end column address. A program circuit, which may include elements 130, 140, 150, 160, 170 and/or 180 of FIG. 3, is configured to verify a programming operation of the memory cells for a selected row at the subset of the columns that extends from the initial column address to the end column address. In other embodiments, the program circuit may be further configured to perform a programming operation of the subset of the columns that extends from the initial column address to the end column address, for the selected row. The columns may correspond to the entire memory cell array, or the columns may correspond to a page of the memory cell array, and the subset of the columns may correspond to a subset of the columns of the page.

Figure 4:
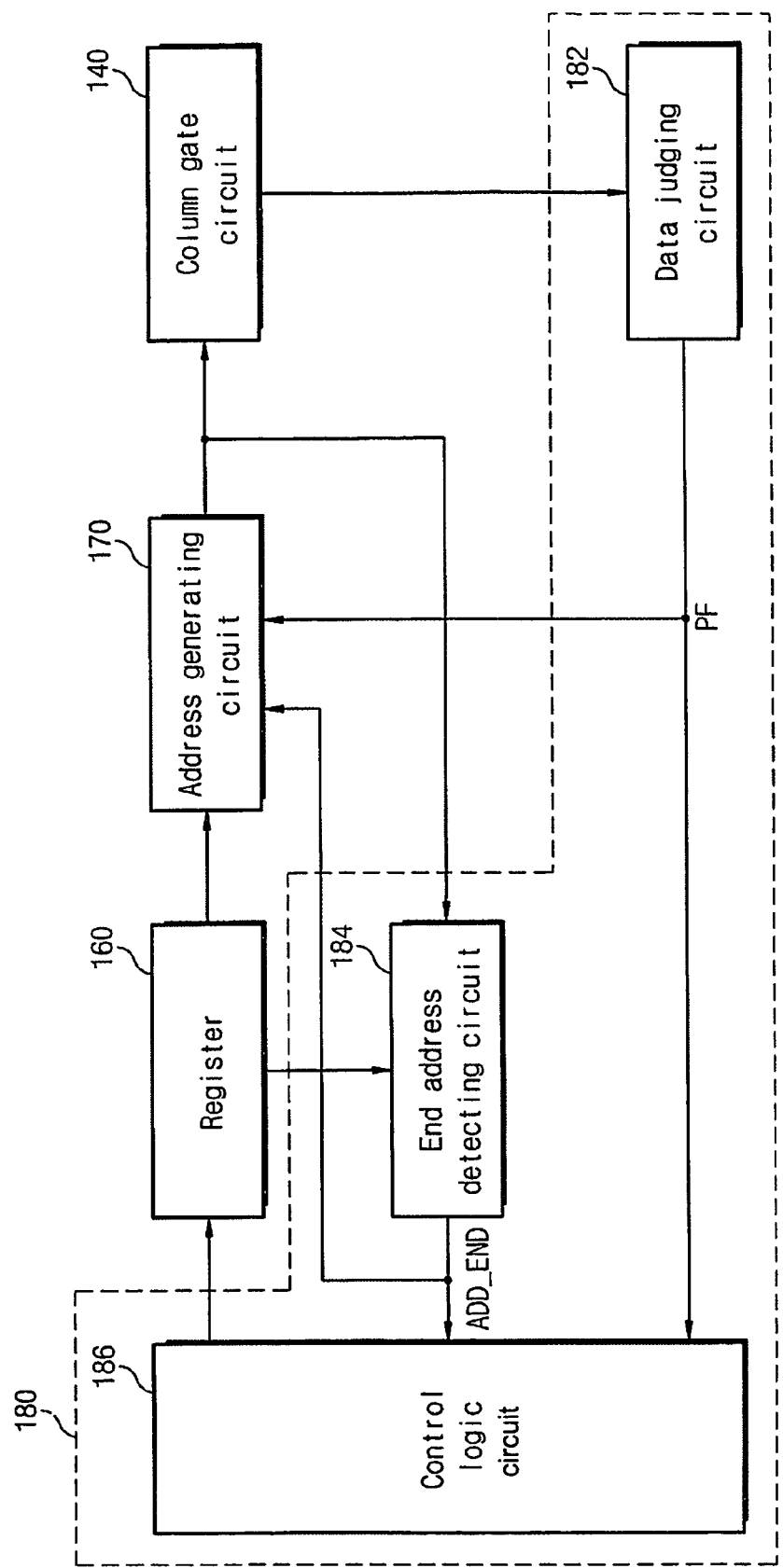
FIG. 4 is a block diagram of a scan control circuit of FIG. 3 according to exemplary embodiments of the present invention.

FIG. 4 is a block diagram showing a scan control circuit of FIG. 3 according to exemplary embodiments of the present invention. Referring to FIG. 4, the scan control circuit 180 includes a data judging circuit 182, an end address detecting circuit 184, and a control logic circuit 186.

Data judging circuit 182 detects whether all of data bits transferred from the column gate circuit 140 are in the programmed state (also referred to as a "program state") during a program verification operation. When all input data bits are in the program state, the data judging circuit 182 outputs a pass/fail signal PF indicating a program pass. When only a part of the input data bits are in the program state, the data judging circuit 182 outputs pass/fail signal PF indicating a program fail. When the pass/fail signal PF indicates a program pass, the address generating circuit 170 generates a next column address. In contrast, when the pass/fail signal PF indicates a program fail, a next column address is not generated by the address generating circuit 170. However, in some embodiments, even when the next column address is not generated, a previously generated column address is not reset during a program operation and is maintained by the address generating circuit 170.

An end address generating circuit 184 detects whether or not a column address generated from the address generating circuit 170 is identical to (reaches) an end storing address stored in the address storing circuit 160. For example, when the column address generated from the address generating circuit 170 does not reach the end column address stored in the address storing circuit 160, the end address detecting circuit 184 deactivates a detection signal ADD_END. When the column address generated from the address generating circuit 170 reaches the end column address stored in the address storing circuit 160, the end address detecting circuit 184 activates the detection signal ADD_END. When the detection signal ADD_END is activated, the next column address is not generated by the address generating circuit 170.

The control logic circuit 186 controls the address storing circuit 160 so as to store initial/end column addresses that are applied from external to the device during a program operation. For instance, during a program operation, initial/end column addresses may be stored in the address storing circuit 160 under the control of the control logic circuit 186 before data is stored in the page buffer circuit 130. Also, the initial column address is stored in the address storing circuit 160 under the control of the control logic circuit 186 before data to be programmed is stored in the page buffer circuit 130. Finally, after all data to be programmed are stored in the page buffer circuit 130, a column address finally generated in the address generating circuit 170 may be stored as a final column address in the address storing circuit 160 under the control of the control logic circuit 186. The control logic circuit 186 controls program and program verification operations in response to the pass/fail signal PF and the detection signal ADD_END. This will be described in more detail below. The control logic circuit 186 may be embodied as special purpose hardware and/or a processor operating under stored program control.

In a nonvolatile memory device according to exemplary embodiments of the present invention, the control logic circuit 186 (or the scan control circuit 180) is constructed to interface with an external device according to one of NAND interface mode, NOR interface mode, and SRAM interface mode. These interface modes are well known to those having skill in the art and need not be described further herein.

Figure 5:
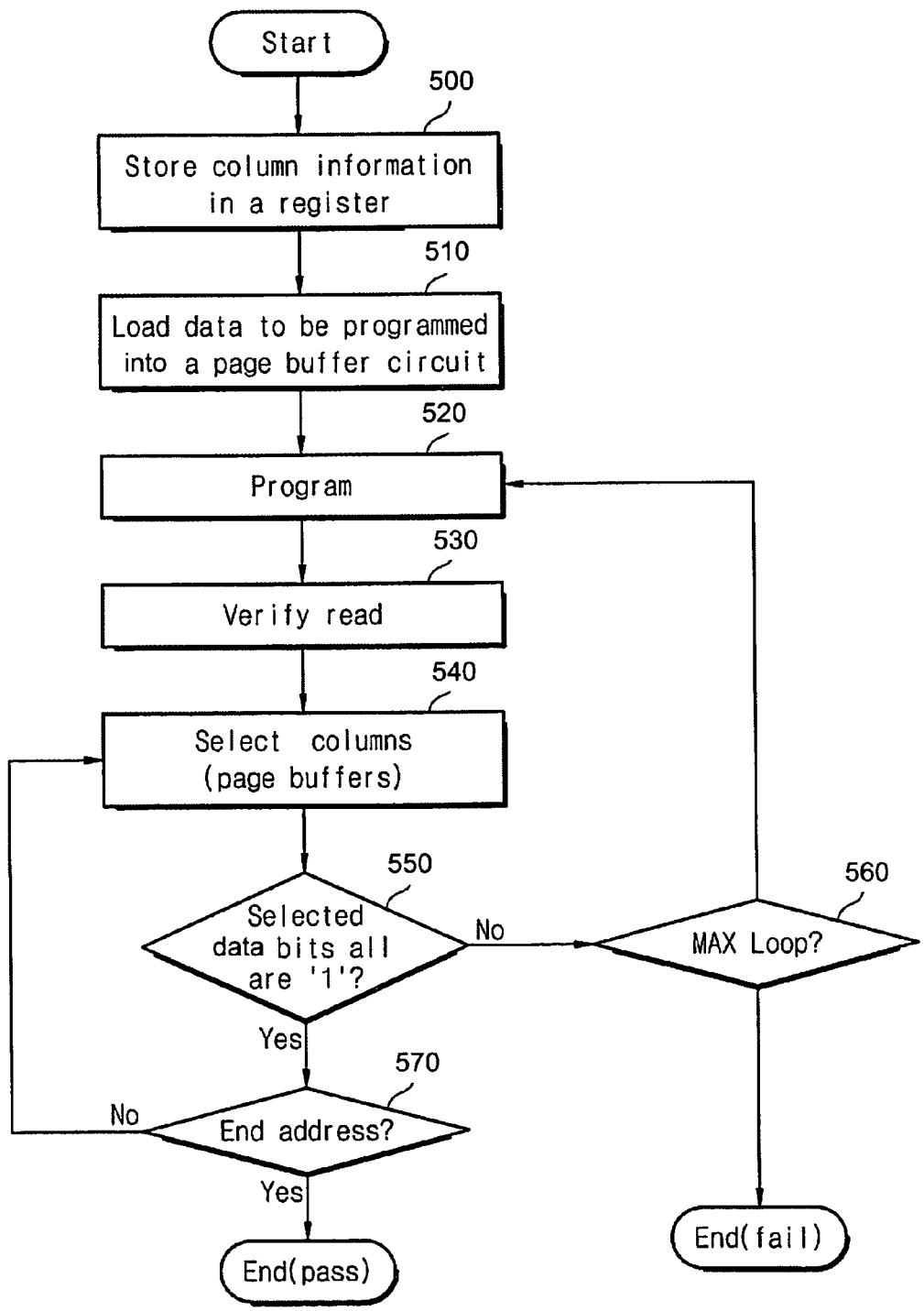
FIG. 5 is a flowchart illustrating program operations and program verification operations of a nonvolatile memory device according to exemplary embodiments of the present invention.

FIG. 5 is a flowchart illustrating program and program verification operations of nonvolatile memory devices according to exemplary embodiments of the present invention. These operations may be performed in a device according to FIGS. 3 and/or 4. Hereinafter, program and program verification operations of the nonvolatile memory device according to exemplary embodiments of the present invention will be more fully described with reference to accompanying drawings. As well known, when the nonvolatile memory device enters a program operation mode, a plurality of program loops are automatically performed under control of the control logic circuit 186. Each of the program loops includes a program section and a program verification section. In the program section, memory cells of a selected page (or row) are programmed according to data values that are loaded in the page buffer circuit 130. In the program verification section, whether the memory cells of the selected row are normally programmed should be detected within a program loop time. If not, the program operation may be ended as a program fail.

When a program operation mode starts, column address information supplied from external to the device is stored in the address storing circuit 160 under control of the control logic circuit 186 at Block 500. The column address information includes an initial column address or initial and end column addresses. In this case, assume that the column address information includes the initial and end column addresses. After the column address information is stored in the address storing circuit 160, data to be programmed is loaded in the page buffer circuit 130 at Block 510. The address generating circuit 170 generates a column address for receiving first word/byte data in response to the initial column address. The column gate circuit 140 selects a part of the page buffers in response to the column address generated from the address generating circuit 170. Data bits input through the column gate circuit 140 are stored in the selected page buffers, respectively. Then, the address generating circuit 170 generates a next column address, and the column gate circuit 140 selects a part of the rest of the page buffers in response to the next column address generated from the address generating circuit 170. Through these operations, all data to be programmed may be loaded in the page buffer circuit 130. An end column address can be provided as the column address generated by the address generating circuit 170 to receive end byte/word data. If only an initial column address is stored in the address storing circuit 160, the end column address generated in a data loading section may be stored as an end column address in the address storing circuit 160 under control of the control logic circuit 186.

The amount of data loaded in the page buffer circuit 130 may be as much as one page or may be smaller than one page. Assume that the amount of data loaded in the page buffer circuit 130 is smaller than one page. For instance, referring back to FIG. 2, assume that data bits are loaded only in the page buffers (hereinafter, referred to as a "data loading region"), which are connected to the bit lines BL0-BLi.

After all data to be programmed are loaded in the page buffer circuit 130, a program operation of the first program loop may be performed in well known manner at Block 520. After the program operation is performed, a verification reading operation of the first program loop is performed at Block 530. In accordance with the verification reading operation, data bits of all memory cells of a selected row (or page) are read by the page buffer circuit 130. After that, a column scan operation will be performed in order to detect program pass/fail with the read data bits.

The initial column address stored in the address storing circuit 160 is transferred to the address generating circuit 170 under a control of the control logic circuit 186. The address generating circuit 170 generates a column address for selecting the first word/byte data in response to the initial column address. The column gate circuit 140 selects a part of page buffers (or columns) in response to the column address generated in the address generating circuit 170 at Block 540. Data bits of the selected page buffers are transferred to the data detecting circuit 182 by the column gate circuit 140. The data detecting circuit 182 detects whether all of the input data bits have a program state (e.g., logic 1), at Block 550. If only a part of the input data bits have the program state (e.g., logic 1), the data detecting circuit 182 generates the pass/fail signal PF indicating a program fail. As a result, a next column address is not generated by the address generating circuit 170. However, even if the column address is not generated any more, a column address (an address for selecting columns including a memory cell that is identified as program fail) generated in the first program loop may be maintained. At the same time, the control logic circuit 186 ends the program verification section in response to the pass/fail signal PF and detects whether a program loop time has reached the maximum program loop time at Block 560. If the program loop time is less than the maximum program loop time, the control logic circuit 186 controls the row selection circuit 120 and the page buffer circuit 130 so as to perform a program operation of the second program loop. The program operation of the second program loop can be performed in the same manner as explained in connection with Block 520.

In contrast, if all of the input data bits have the program state (e.g., logic 1), the data detecting circuit 182 generates the pass/fail signal PF indicating program pass. At Block 570, the end address detecting circuit 184 detects whether the column address generated by the address generating circuit 170 has reached the end column address stored in the address storing circuit 160. If the column address generated by the address generating circuit 170 did not reach the end column address stored in the address storing circuit 160, the address generating circuit 170 generates a next column address. That is, if the pass/fail signal PF indicates program pass, and the detection signal ADD_END is not activated, the address generating circuit 170 generates a next column address for a next program loop. In response to generating of the next column address, the column gate circuit 140 selects a part of the rest of the page buffers in response to the column address. Blocks 550, 560 and 570 can then be performed in the same manner as described above.

In Bock 570, if the column address generated by the address generating circuit 170 reaches the end column address stored in the address storing circuit 160, the address detecting circuit 184 activates the detection signal ADD_END. As a result, the column address by the address generating circuit 170 is not generated any more. At the same time, the control logic circuit 186 ends a program operation with respect to the loaded data, that is, a program operation mode in response to an activation of the detection signal ADD_END.

As previously mentioned, according to exemplary embodiments of the present invention, a column region defined during a program verification operation does not include all columns of one page but, rather, columns that are defined by initial and end column addresses. In the program verification operation, only columns included in the data loading region are selected. In this case, data to be programmed is loaded in the data loading region. In other words, according to exemplary embodiments of the present invention, all columns are not selected in the program verification operation, but only columns defined by initial and end column addresses are selected in partially performing the program verification. For this reason, it is possible to reduce a column scan time or a program verification time. A potential effect of a nonvolatile memory device according to exemplary embodiments of the present invention will be more fully described referring to FIGS. 6A to 6C.

For example, it is assumed that a page size is 2K-byte, and an internal operation cycle is 40 ns. A program operation mode is usually classified into a data loading section, a high voltage setting section, and a plurality of program loops. Each of the program loops is subdivided into a program section and a program verification section. As mentioned previously, a column scan operation is performed in the program verification section. It is assumed that a column gate circuit selects page buffers by a word unit.

Figure 6A:
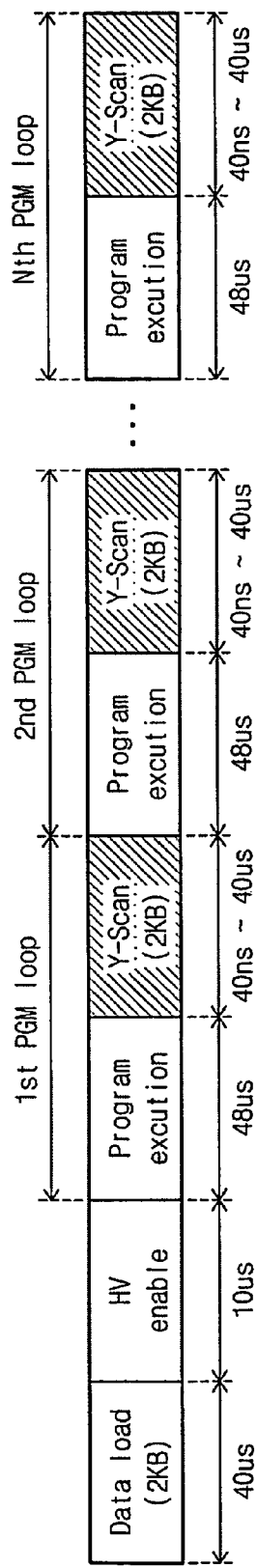
FIGS. 6A through 6C illustrate comparative program times of conventional NAND-type flash memory devices and devices according to exemplary embodiments of the present invention.

In order to program 2K-byte data of one page amount, referring to FIG. 6A, a data loading time of 40 μs and a high voltage setting time of 10 μs are assumed. In addition, a program time of 48 μs is assumed for every program loop. On every program loop, a minimum 40 ns through a maximum 40 μs program verification times (that is, column scan time) are assumed. The maximum column scan time is used for a program verification with respect to all memory cells of one page.

Figure 6B:
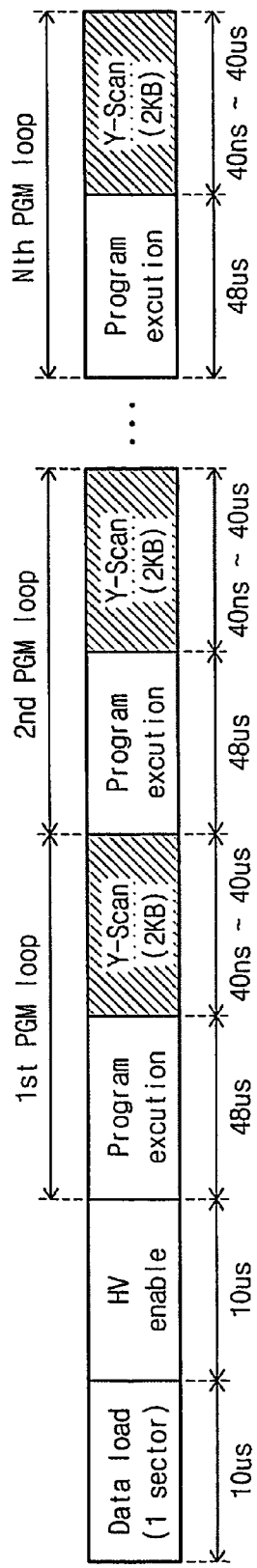

To program 512-byte data of memory cells of one page (also referred to as a sector), referring to FIG. 6B, a data loading time of 10 μs and a high voltage setting time of 10 μs are assumed. A program time of 48 μs is also assumed for every program loop. In every program loop, a minimum 40 ns to a maximum 40 μs program verification times (that is, column scan time) are assumed. Even though only 512-byte data are programmed, there is a request of a column scan time for a program verification operation with respect to all memory cells of one page.

Referring to FIGS. 6A and 6B, a column scan operation is performed with respect to all memory cells of a selected row independent of the amount of data to be programmed. As a result, it takes the same time to program 512-byte data and to program 2K-byte data.

Figure 6C:
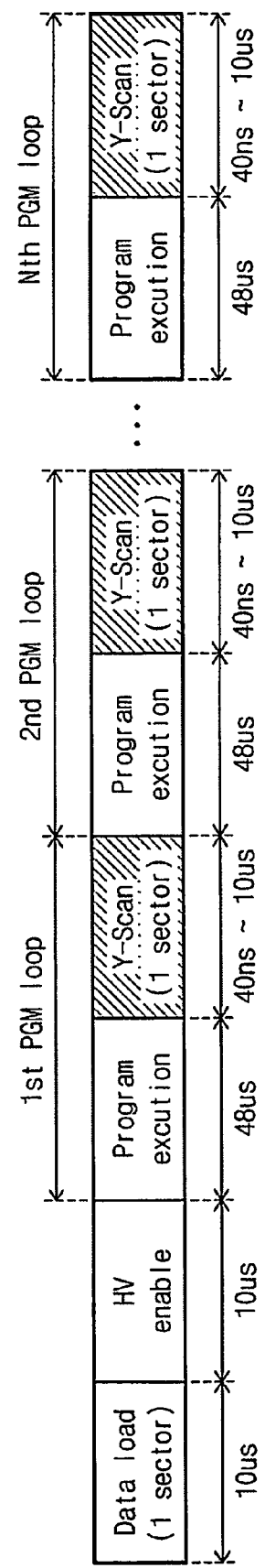

On the other hand, in a nonvolatile memory device according to exemplary embodiments of the present invention, a column scan operation is controlled according to the amount of data to be programmed. In other words, referring to FIG. 6C, a data loading time, a high-voltage setting time, and a program time on every program section are assumed to be the same as FIG. 6B. However, a column scan time is controlled according to the amount of data to be programmed in a program verification section on every program loop. As shown in FIG. 6C, 40 ns to maximum 10 μs program verification times are assumed. Thus, as previously mentioned, it is possible to reduce a program time by controlling a column scan time according to the amount of data to be programmed.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A nonvolatile memory device comprising:
a memory cell array having memory cells arranged in rows and columns;
a page buffer circuit configured to read data bits from memory cells of a selected row during a program verification;
an address storing circuit configured to store column address information of data to be programmed in a page of the memory cell array, wherein the column address information includes an initial column address and an end column address, the initial column address and the end column address defining a subset of columns within the page, the number of columns within the subset being variable from one program operation to another program operation;
an address generating circuit configured to sequentially generate column addresses to select the read data bits in response to the initial column address of the address storing circuit; and a scan control circuit configured to end a program operation mode when a column address generated from the address generating circuit is consistent with the end column address.

2. The nonvolatile memory device as set forth in claim 1, wherein the initial column address is stored in the address storing circuit before the data to be programmed is loaded in the page buffer circuit.

3. The nonvolatile memory device as set forth in claim 2, wherein the address generating circuit sequentially generates column addresses while the data bits to be programmed are loaded in the page buffer circuit.

4. The nonvolatile memory device as set forth in claim 3, wherein when all of the data bits to be programmed are loaded in the page buffer circuit, a column address finally generated in the address generating circuit is stored as the end column address in the address storing circuit.

5. The nonvolatile memory device as set forth in claim 1, wherein the initial and end column addresses are stored in the address storing circuit before the data to be programmed is loaded in the page buffer circuit.

6. The nonvolatile memory device as set forth in claim 1, further comprising a column gate circuit that is configured to select the read data bits in response to the column address of the address generating circuit.

7. The nonvolatile memory device as set forth in claim 1, wherein the scan control circuit is configured to control the address generating circuit according to whether all of the data bits selected by the column gate circuit are in a program state.

8. The nonvolatile memory device as set forth in claim 7, wherein when all of the selected data bits are in a program state, the scan control circuit controls the address generating circuit so as to generate a next column address.

9. The nonvolatile memory device as set forth in claim 7, wherein when a part of the selected data bits are in a program state, the scan control circuit controls the address generating circuit so as not to generate a next column address.

10. The nonvolatile memory device as set forth in claim 1, wherein the scan control circuit is structured to interface with an external device according to one of a NAND interface mode, a NOR interface mode, and a SRAM interface mode.

11. A nonvolatile memory device comprising:
a memory cell array having memory cells arranged in rows and columns;
a page buffer circuit configured to read data bits from the memory cells of a selected row during a program verification;
an address storing circuit configured to store column address information of data to be programmed in a page of the memory cell array, wherein the column address information includes an initial column address and an end column address, the initial column address and the end column address defining a subset of columns within the page, the number of columns within the subset being variable from one program operation to another program operation;
a column selection circuit configured to sequentially select the data bits in response to the initial column address of the address storing circuit during the program verification; and
a scan control circuit configured to control an end of a program operation mode in response to the selected data bits and the end column address.

12. The nonvolatile memory device as set forth in claim 11, wherein the column selection circuit includes:

an address generating circuit configured to sequentially generate column addresses in response to the initial column address; and a column gate circuit configured to select the read data bits in response to the column address.

13. The nonvolatile memory device as set forth in claim 12, wherein the scan control circuit is configured to control the address generating circuit according to whether all of the data bits selected by the column gate circuit are in a program state.

14. The nonvolatile memory device as set forth in claim 13, wherein when all of the selected data bits are in a program state, the scan control circuit controls the address generating circuit so as to generate a next column address.

15. The nonvolatile memory device as set forth in claim 13, wherein when a part of the selected data bits are in a program state, the scan control circuit controls the address generating circuit so as not to generate a next column address.

16. The nonvolatile memory device as set forth in claim 12, wherein the scan control circuit is configured to end the program operation mode when a column address generated from the address generating circuit is consistent with the end column address.

17. The nonvolatile memory device as set forth in claim 12, wherein the address generating circuit is configured to sequentially generate column addresses while the data bits to be programmed are loaded in the page buffer circuit.

18. The nonvolatile memory device as set forth in claim 17, wherein when all of the data bits to be programmed are loaded in the page buffer circuit, a column address finally generated in the address generating circuit is stored as the end column address in the address storing circuit.

19. The nonvolatile memory device as set forth in claim 12, wherein the scan control circuit includes:
   a data judging circuit configured to judge whether all of data bits selected by the column gate circuit are in a program state;
   a detecting circuit configured to detect whether a column address generated in the address generating circuit is consistent with the end column address; and
   a control logic circuit configured to control the end of the program operation mode in response to a judging result of the data judging circuit and a detecting result of the detecting circuit.

20. The nonvolatile memory device as set forth in claim 19, wherein when only a part of data bits selected by the column gate circuit are in a program state, a next column address by the address generating circuit is not generated.

21. The nonvolatile memory device as set forth in claim 20, wherein when a column address generated in the address is an end column address, the control logic circuit ends the program operation mode.

22. The nonvolatile memory device as set forth in claim 19, wherein the control logic circuit is configured to interface with an external device according to one of a NAND interface mode, a NOR interface mode, and a SRAM interface mode.

23. The nonvolatile memory device as set forth in claim 11, wherein the initial column address is stored in the address storing circuit before the data to be programmed is loaded in the page buffer circuit.

24. The nonvolatile memory device as set forth in claim 11, wherein the initial and end column addresses are stored in the address storing circuit before the data to be programmed is loaded in the page buffer circuit.

25. A nonvolatile memory device comprising:
   a memory cell array having memory cells arranged in rows and columns;
   a page buffer circuit configured to read data bits from the memory cells of a selected row during a program verification;
   an address storing circuit configured to store column address information of data to be programmed in a page of the memory cell array, wherein the column address information includes an initial column address and an end column address, the initial column address and the end column address defining a subset of columns within the page, the number of columns within the subset being variable from one program operation to another program operation;
   an address generating circuit configured to generate a column address in response to an initial column address of the address storing circuit;
   a column gate circuit configured to select the data bits in response to the column address;
   a data judging circuit configured to detect whether the selected data bits are in a program state, wherein the address generating circuit is controlled by a judging result of the data judging circuit;
   a detecting circuit configured to detect whether a column address generated in the address generating circuit is consistent with an end column address of the address storing circuit; and
   a control logic circuit configured to control an end of a program operation mode in response to a detecting result of the detecting circuit and the judging result of the data judging circuit.

26. The nonvolatile memory device as set forth in claim 25, wherein the initial column address is stored in the address storing circuit before the data to be programmed is loaded in the page buffer circuit.

27. The nonvolatile memory device as set forth in claim 26, wherein the address generating circuit is configured to sequentially generate column addresses while data bits to be programmed are loaded in the page buffer circuit.

28. The nonvolatile memory device as set forth in claim 27, wherein when all of data bits to be programmed are loaded in the page buffer circuit, a column address finally generated in the address generating circuit is stored as the end address in the address storing circuit.

29. The nonvolatile memory device as set forth in claim 27, wherein the control logic circuit ends the program operation when the column address generated in the address generating circuit is consistent with the end column address.

30. The nonvolatile memory device as set forth in claim 25, wherein the initial and end column addresses are stored in the address storing circuit before the data to be programmed is loaded in the page buffer circuit.

31. The nonvolatile memory device as set forth in claim 25, wherein when only a part of the data bits selected by the column gate circuit are in a program state, a next column address by the address generating circuit is not generated during the program verification.

32. The nonvolatile memory device as set forth in claim 25, wherein when all of the data bits selected by the column gate circuit are in a program state, the address generating circuit generates a next column address during the program verification.

33. The nonvolatile memory device as set forth in claim 25, wherein the control logic circuit is structured to interface with an external device according to one of a NAND interface mode, a NOR interface mode, and a SRAM interface mode.

34. A method for programming a nonvolatile memory device including memory cells arranged in rows and columns, the method comprising:

storing column address information including initial and end column addresses of a page of the nonvolatile memory device, the initial column address and the end column address defining a subset of columns within the page, the number of columns within the subset being variable from one program operation to another program operation; and performing a column scan operation according to the column address information after a program operation, wherein only columns of a loaded data region defined by the initial and end column addresses during the column scan operation are scanned.

35. The method as set forth in claim 34, wherein performing the column scan operation includes:

generating a column address to select the columns in response to the initial column address during the column scan operation; and determining an end of a program operation mode according to whether the generated column address is consistent with the end column address.

36. The method as set forth in claim 35, wherein performing the column scan operation further includes ending the program operation mode when the generated column address is consistent with the end column address.

37. The method as set forth in claim 34, further comprising loading data to be programmed before the program operation.

38. A nonvolatile memory device comprising:

a memory cell array having memory cells arranged in rows and columns;

a page buffer circuit configured to read memory cells of a selected row during a program verification;

a storage circuit configured to store column address information of data to be programmed in a page of the memory cell array, wherein the column address information includes initial column information and end column information, the initial column address and the end column address defining a subset of columns within the page, the number of columns within the subset being variable from one program operation to another program operation; and an address generating control circuit configured to control generating an address with respect to memory cells to be selected using the initial column information and the end column information of the storage circuit.

39. The nonvolatile memory device as set forth in claim 38, wherein the initial column information is an initial column address.

40. The nonvolatile memory device as set forth in claim 39, wherein the initial column address is stored in the storage circuit before the data to be programmed is loaded in the page buffer circuit.

41. The nonvolatile memory device as set forth in claim 40, wherein the address generating circuit is configured to sequentially generate an address according to the initial column information.

42. The nonvolatile memory device as set forth in claim 39, wherein the address generating circuit is configured to control generating an address according to whether all of data bits selected by the column gate circuit are in a program state.

43. The nonvolatile memory device as set forth in claim 42, wherein when all of the selected data bits are in a program state, the address generating control circuit generates a next column address.

44. The nonvolatile memory device as set forth in claim 42, wherein when only a part of the selected data bits are in a program state, the address generating circuit does not generate a next column address.

45. The nonvolatile memory device as set forth in claim 38, wherein the end column information is an end column address.

46. The nonvolatile memory device as set forth in claim 45, wherein the end column address is stored in the storage circuit before the data to be programmed is loaded in the page buffer circuit.

47. The nonvolatile memory device as set forth in claim 45, wherein the address generating circuit is configured to end an operation mode by comparing an address sequentially generated from the initial column address with the end column address.

48. The nonvolatile memory device as set forth in claim 38, wherein the end column information represents an amount of data to be loaded.

49. The nonvolatile memory device as set forth in claim 48, wherein the end column information is stored in the storage circuit before the data to be programmed is loaded in the page buffer.

50. The nonvolatile memory device as set forth in claim 38, wherein the address generating circuit compares an increment amount of an address sequentially generated and data amount information of the data to be loaded to end an operation mode.

51. The nonvolatile memory device as set forth in claim 38, further comprising a column gate circuit that is configured to select the read data bits in response to a column address from the address generating control circuit.

52. A nonvolatile memory device comprising:

a memory cell array having memory cells arranged in rows and columns;

an address storing unit that is configured to store therein an indicator of an initial column address of a page of the memory cell array and an indicator of an end column address of the page of the memory cell array, the initial column address and the end column address defining a subset of columns within the page, the number of columns within the subset being variable from one program operation to another program operation; and a program circuit that is configured to verify a programming operation of the memory cells for a selected row at the subset of the columns that extends from the initial column address to the end column address.

53. The nonvolatile memory device as set forth in claim 52 wherein the program circuit is further configured to perform a programming operation of the subset of the columns that extends from the initial column address to the end column address, for the selected row.

54. A nonvolatile memory device as set forth in claim 52 wherein the columns correspond to a page of the memory cell array and wherein the subset of the columns corresponds to a subset of the columns of the page.

55. A method of programming a nonvolatile memory device including a memory cell array having memory cells arranged in rows and columns, the method comprising:

storing an indicator of an initial column address and an indicator of an end column address of the page of the memory cell array to identify a subset of the columns that extends from the initial column address to the end column address, the initial column address and the end column address defining a subset of columns within the page, the number of columns within the subset being variable from one program operation to another program operation; and verifying a programming operation of the memory cells for a selected row at the subset of the columns that extends from the initial column address to the end column address.

56. The method as set forth in claim 55 further comprising:

performing a programming operation of the subset of the columns that extends from the initial column address to the end column address, for the selected row.

57. The method as set forth in claim 55 wherein the columns correspond to a page of the memory cell array and wherein the subset of the columns corresponds to a subset of the columns of the page.

58. A method of programming a nonvolatile memory device including a memory cell array having memory cells arranged in rows and columns, the method comprising:

storing an indicator of an initial column address and an indicator of an end column address of the page of the memory cells to identify a subset of the columns that extends from the initial column address to the end column address, the initial column address and the end column address defining a subset of columns within the page, the number of columns within the subset being variable from one program operation to another program operation;

programming the page of the memory cells; and verifying a programming operation of the memory cells for a selected row at the subset of the columns that extends from the initial column address to the end column address.

* * * * *